United States Patent [19]
Gershon

[11] Patent Number: 6,160,856
[45] Date of Patent: Dec. 12, 2000

[54] SYSTEM FOR PROVIDING AMPLITUDE AND PHASE MODULATION OF LINE SIGNALS USING DELAY LINES

[75] Inventor: Eugen Gershon, San Jose, Calif.

[73] Assignee: Advanced Micro Devices, Inc., Sunnyvale, Calif.

[21] Appl. No.: 08/992,816

[22] Filed: Dec. 18, 1997

[51] Int. Cl.[7] ............................. H03D 1/24; H03H 9/00
[52] U.S. Cl. ............................. 375/320; 333/149
[58] Field of Search ................... 375/320, 268, 375/345, 257, 222, 341, 262; 330/149, 144, 145, 151

[56] References Cited

U.S. PATENT DOCUMENTS

| | | | |
|---|---|---|---|
| 4,019,140 | 4/1977 | Swerdlow | 455/63 |
| 5,132,572 | 7/1992 | Woo | 326/73 |
| 5,153,527 | 10/1992 | Yaguchi | 329/307 |
| 5,220,216 | 6/1993 | Woo | 326/50 |
| 5,227,679 | 7/1993 | Woo | 326/50 |
| 5,264,745 | 11/1993 | Woo | 326/62 |
| 5,349,612 | 9/1994 | Guo et al. | 375/371 |
| 5,355,092 | 10/1994 | Kosaka et al. | 329/304 |
| 5,363,419 | 11/1994 | Ho | 375/376 |
| 5,367,542 | 11/1994 | Guo | 375/359 |
| 5,400,370 | 3/1995 | Guo | 375/371 |
| 5,452,333 | 9/1995 | Guo et al. | 375/371 |
| 5,457,719 | 10/1995 | Guo et al. | 375/375 |
| 5,787,117 | 7/1998 | Ash | 375/223 |

*Primary Examiner*—Chi H. Pham
*Assistant Examiner*—Khai Tran

[57] ABSTRACT

A system for amplitude and phase modulation combines digital and analog circuitry for converting digital data into a line signal. Amplitude and phase decoders decode the digital data to determine the amplitude and phase required to represent the current symbol of the digital data. A reference oscillator produces a carrier signal supplied to a digital delay line composed of a sequence of delay cells. Outputs of the delay cells are supplied to a phase selector controlled by the phase decoder to select the required phase of the carrier signal. The carrier signal having the selected phase is fed to a variable gain amplifier controlled by the amplitude decoder to produce the carrier signal with the required amplitude.

13 Claims, 1 Drawing Sheet

SYSTEM FOR PROVIDING AMPLITUDE AND PHASE MODULATION OF LINE SIGNALS USING DELAY LINES

TECHNICAL FIELD

The present invention relates to digital data transmission using analog signals and, more particularly, to a novel system for providing amplitude and phase modulation of a line signal using a digital delay line.

BACKGROUND ART

In data networks designed to receive, switch and transmit analog signals, digital devices are attached to a communication line via a modem that converts digital data to analog line signals, and vice versa. The modem modulates data prior to sending them over such communication lines as a telephone wire, a CATV coaxial cable, an optical cable, or a wireless communication link. The basis for analog signal transmission is a continuous constant-frequency signal known as a carrier signal. For example, the carrier signal may be defined as $v_s(t)=V_s\cos(2\pi ft+\phi_s)$, where f is the frequency, $V_s$ is the amplitude, and $\phi_s$ is the phase of the carrier signal. Modulation involves operation on one or more of the three characteristics of the carrier signal: amplitude, frequency or phase. Accordingly, three basic modulation techniques are used for transforming digital data into analog line signals: amplitude modulation, frequency-shift keying and phase modulation or phase-shift keying.

Digital data are represented by a finite number of values, each of which defines a digital symbol. Each symbol may be composed of one or more bits. Amplitude modulation enables a modem to transmit analog equivalents of digital symbols by varying the amplitude of the carrier signal. For example, if a symbol consists of two bits, the entire continuous range of the signal amplitudes is divided into four bands, each of which represents one of four possible symbols 00, 01, 10 or 11. For instance, for a signal in a range from −3 V to 3 V, amplitudes smaller than −2 V may represent 00, amplitudes between −2 V and 0 V may correspond to 01, amplitudes between 0 V and 2 V may represent 10, and amplitudes larger than 2 V may correspond to 11. Alternatively, such transformation may be carried out by pulse-amplitude modulation that uses a pulse carrier.

Frequency-shift keying may use different frequencies of the carrier signal to represent binary 1 and binary 0. This technique is suitable for low-speed devices.

In phase modulation, the carrier signal is shifted a certain number of degrees in response to the digital pattern coming from a digital device. For example, to represent two-bit symbols 00, 01, 10 or 11, four phase values of the carrier signal are required. For instance, a phase value between 0 and $\pi/2$ may correspond to 00, a phase value between $\pi/2$ and $\pi$ may represent 01, etc.

Amplitude and phase modulations of a carrier signal may be combined to form a line signal with amplitude and phase representing digital data to be transmitted. Each symbol of the digital data may be defined as a vector with a certain length represented by the amplitude of the line signal, and a certain angle or phase with respect to a reference, for example, the horizontal axis. For instance, in each 4-bit digital symbol, two bits may be represented by four different values of amplitude, and two bits may be represented by four different values of phase.

Various modulation techniques have been developed for modems that convert digital data to analog signals. These techniques are built either entirely on digital circuitry or entirely on analog circuitry. However, digital modulators are slow and may be used only for low-speed applications, such as voice-band modems. Although analog modulators are much faster than the digital systems, their reliability is poor.

Thus, it would be desirable to provide a novel system for converting digital data into analog line signals, which would be faster than the digital systems and more reliable than the analog systems.

Also, it would be desirable to provide a novel system for amplitudede and phase modulation of line signals representing digital data.

DISCLOSURE OF THE INVENTION

Accordingly, one advantage of the present invention is in providing a fast and reliable system for converting digital data into analog line signals.

Another advantage of the present invention is in providing a novel system for amplitude and phase modulation of line signals representing digital data.

The above and other advantages of the invention are achieved, at least in part, by providing an amplitude and phase modulation system that comprises a digital amplitude decoder supplied with input digital data for producing an amplitude information signal. A digital phase decoder is supplied with the input digital data for producing a phase information signal. A reference oscillator produces a carrier signal fed to a digital delay line having a plurality of delay cells. An analog multiplexer controlled by the phase information signal produces a phased carrier signal representing the carrier signal delayed by a selected delay cell of the delay line. A variable gain amplifier having its gain controlled by the amplitude information signal amplifies the phased carrier signal to produce an analog line sianal to be transmitted via a communication line.

In accordance with one aspect of the present invention, the input digital data may be supplied to a symbol selector that selects digital symbols to be encoded. The selector may provide the amplitude decoder with at least one data bit to be represented by amplitude modulation of the line signal. The phase decoder may be supplied with at least one data bit to be represented by phase modulation of the line signal.

In accordance with another aspect of the invention, the delay cells having equal delay periods may be connected in series to provide sequential delay of the carrier signal supplied to the first cell of the delay line.

In accordance with a further aspect of the invention, the reference oscillator may comprise a crystal oscillator that produces the carrier signal at the carrier frequency of the line signal. A line driver may be used to make the line signal suitable for the transmission over the communication line.

In accordance with a method of the present invention, the following steps are carrier out to convert digital data into an analog line signal:

- decoding the digital data to produce an amplitude information signal indicating amplitude values of the line signal required to represent the digital data,
- decoding the digital data to produce a phase information signal indicating phase values of the line signal required to represent the digital data,
- delaying a carrier signal by a digital delay line having a variable delay controlled by the phase information signal to produce a phased carrier signal, and
- amplifying the phased carrier signal by an amplifier having a variable gain controlled by the amplitude information signal to produce said analog line signal.

The carrier signal may be sequentially delayed by multiple delay cells to produce multiple delayed signals at outputs of the delay cells. The delayed signals may be multiplexed by an analog multiplexer controlled by the phase information signal.

In accordance with a further aspect of the present invention, a system for converting digital data into an analog line signal may comprise a digital decoder for decoding the digital data to produce amplitude and phase information signals indicating amplitude and phase values of the line signal required to represent the digital data. The phase information signal may control a variable delay time of a digital delay line to delay a carrier signal by a required amount. The amplitude information signal may control a variable gain of an amplifier to amplify the delayed carrier signal by a required gain.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
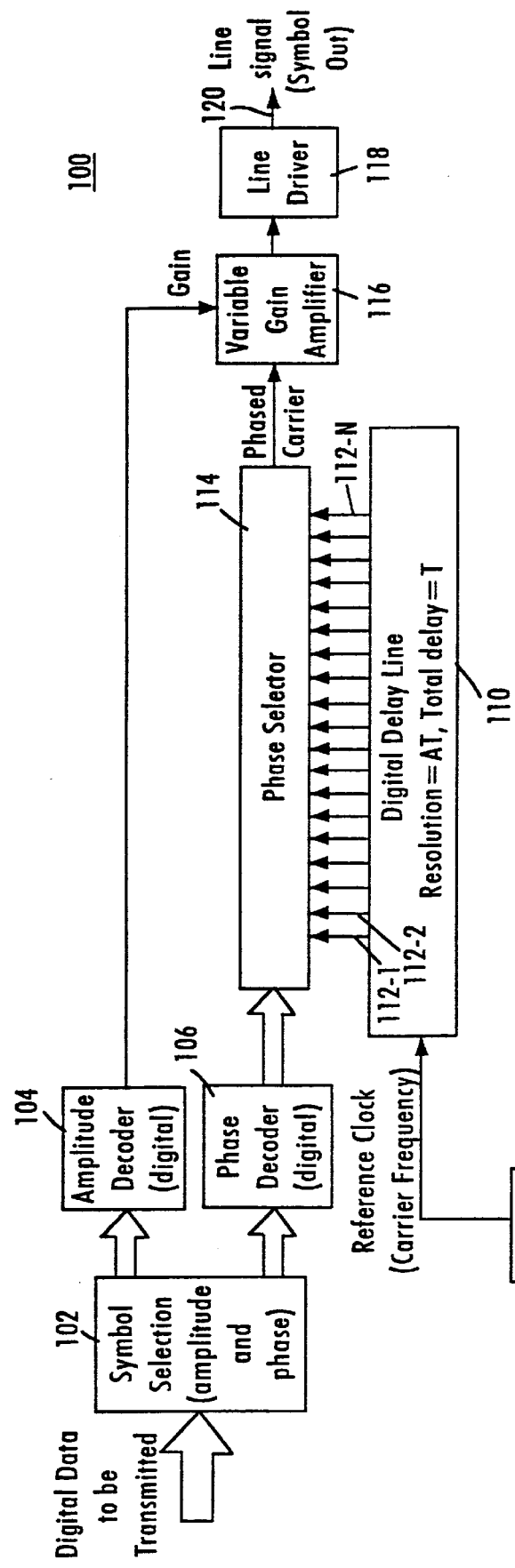
FIG. 1 is a block diagram of a transmitter for a modem of the present invention.

Although the invention has general applicability in the field of data processing, the best mode for practicing the invention is based in part on the realization of a transmitter for a modem that converts digital data into an amplitude and phase modulated line signal to be transmitted via a communication line.

Referring to FIG. 1, a transmitter 100 comprises a symbol selection circuit 102 supplied with digital data to be transmitted over a communication line. The symbol selection circuit 102 divides the data into symbols composed of a predetermined number of bits. In each symbol, the symbol selection circuit selects one or more bits to be represented by amplitude modulation of a carrier signal, and one or more bits to be represented by phase modulation of the carrier signal. For example, in a 4-bit symbol, the first and second bits may be selected for amplitude modulation, and the third and fourth bits may be selected for phase modulation.

The bits selected for amplitude modulation are fed to a digital amplitude decoder 104 that generates an amplitude information signal indicating amplitude values required to represent the selected bits. The bits selected for phase modulation are supplied to a digital phase decoder 106 that generates a phase information signal indicating phase values required to represent the selected bits.

A crystal oscillator 108 produces reference clock pulses at a carrier frequency. The clock pulses are supplied to an input of a digital delay line 110 consisting of n delay cells coupled to each other. Each of the delay cells composed, for example, of a pair of inverters delays the input clock signal by a fixed delay amount equal to $\Delta T$. A delayed signal from an output of each delay cell is supplied to the input of the next delay cell. Thus, the total delay time T provided by the delay line 110 is equal to $n\Delta T$. It should be understood that other delay structures may be used in the delay line 110, instead of pairs of inverters.

The delay line 110 is provided with outputs 112-1, 112-2, . . . , 112-n for supplying signals produced at the output of each delay cell. The first output 112-1 supplies the put signal produced by the first delay cell and delayed by $\Delta T$ with respect to the input clock signal. The signal at the second output 112-2 is delayed by $2\Delta T$, etc. Finally, the last output 112-n corresponds to the output signal of the delay line 100 delayed by delay $T=n\Delta T$ with respect to the input clock signal. An example of the delay line 110 is presented in U.S. Pat. No. 5,457,719 incorporated herewith by reference.

The outputs 112-1, 112-2, . . . , 112-n are connected to inputs of a chase selector 114 controlled by the phase information signal produced at the output of the phase decoder 106. The phase selector 114 is an analog multiplexer that produces at its output one of its input signals supplied from the outputs 112-1, . . . , 112-2, . . . , 112-n. The phase information signal supplied to a control input of the phase selector 114 selects the input signal to be reproduced at the output. Thus, the phase selector 114 produces the carrier frequency signal delayed with respect to the reference clock signal by a delay amount defined by the phase detector 106. This output signal corresponds to the carrier signal having a phase selected between 0 and T with a resolution of $\Delta T$.

The phased carrier signal is fed to a variable gain amplifier 116 having its control input supplied with the amplitude information signal from the amplitude decoder 104. The amplifier 116 amplifies the phased carrier signal by a gain defined by the amplitude decoder 104. Thus, the amplifier 116 produces the carrier frequency signal having the amplitude and phase that represent the current symbol of the digital data to be transmitted. The output signal of the amplifier 116 is supplied to a line driver 118 that produces a line signal adjusted to meet specific requirements of a communication line 120 used for the transmission of the digital data. The transmitter 100 of the present invention may be used for various types of transmission media, such as a twisted-pair telephone cable, CATV coaxial cable, fiber optical cable, or wireless communication line using radio or infrared signalling. The line signal produced by the line driver 118 has an amplitude proportional to the amplitude at the output of the amplifier 116, and the same phase as the output signal of the amplifier 116. Accordingly, the amplitude and phase of the line signal are modulated in accordance with the current symbol of the digital data to be transmitted. The line signal is transmitted at the carrier frequency defined by the crystal oscillator 108.

When no data is supplied to the transmitter 100, it produces a carrier signal having a reference amplitude level and a reference phase level. These levels depend on the circuit implementation of the transmitter 100 and may be set to zero.

At a receiving side, the line signal is demodulated to recover the digital data. The demodulation may be performed using a delay line matched with the digital delay line 110. The recovery of the digital data is discussed in our copending application Ser. No. 08/992,813 entitled "SYSTEM FOR RECOVERY DIGITAL DATA FROM AMPLITUDE AND PHASE MODULATED LINE SIGNALS USING DELAY LINES" filed concurrently herewith and incorporated by reference.

There accordingly has been described a system for amplitude and phase modulation that combines digital and analog circuitry for converting digital data into a line signal. Amplitude and phase decoders decode the digital data to determine the amplitude and phase required to represent the current symbol of the digital data. A reference oscillator produces a carrier signal supplied to a digital delay line composed of a sequence of delay cells. Outputs of the delay cells are supplied to a phase selector controlled by the phase decoder to select the required phase of the carrier signal. The carrier signal having the selected phase is fed to a variable gain amplifier controlled by the amplitude decoder to produce the carrier signal with the required amplitude.

In this disclosure, there are shown and described only the preferred embodiments of the invention, but it is to be understood that the invention is capable of changes and modifications within the scope of the inventive concept as expressed herein.

What is claimed is:

1. A system for amplitude and phase modulation of an analog line signal representing digital data, comprising:

a digital amplitude decoder responsive to said digital data for producing an amplitude information signal corresponding to the input digital data, a digital chase decoder responsive to the input digital data for producing a phase information signal corresponding to the input digital data, a reference oscillator for producing a carrier signal, a digital delay line coupled to said reference oscillator and having a plurality of delay cells for delaying said carrier signal, an analog multiplexer controlled by said phase information signal for producing a phased carrier signal representing said carrier signal delayed by a selected delay cell of said delay line, and a variable gain amplifier having a gain controlled by said amplitude information signal for amplifying said phased carrier signal to produce said analog line signal to be transmitted via a communication line.

2. The system of claim 1, further comprising a selector supplied with the input digital data for selecting digital symbols to be encoded.

3. The system of claim 2, wherein said selector is coupled to said amplitude decoder for supplying at least one bit of said symbol to be represented by amplitude modulation of the line signal.

4. The system of claim 3, wherein said selector is coupled to said phase decoder for supplying at least one bit of said symbol to be represented by phase modulation of the line signal.

5. The system of claim 1, further comprising a line driver coupled to said variable gain amplifier for generating the line signal suitable for said communication line.

6. The system of claim 1, wherein said delay cells have equal delyv periods.

7. The system of claim 1, wherein said delay cells are connected in series to provide sequential delay of said carrier signal.

8. The system of claim 7, wherein said carrier signal is supplied to the first cell of the delay line.

9. The system of claim 1, wherein said reference oscillator comprises a crystal oscillator for producing said carrier signal at a carrier frequency of said line signal.

10. A method of converting digital data into an analog line signal, comprising the steps of:

decoding the digital data to produce an amplitude information signal indicating amplitude values of the line signal required to represent the digital data, decoding the digital data to produce a phase information signal indicating phase values of the line signal required to represent the digital data, delaying a carrier signal by a digital delay line having a variable delay controlled by the phase information signal to produce a phased carrier signal, and amplifying the phased carrier signal by an amplifier having a variable gain controlled by the amplitude information signal to produce said analog line signal.

11. The method of claim 10, wherein said step of delaying comprising the step of sequential delaying said carrier signal by multiple delay cells to produce multiple delayed signals at outputs of said delay cells.

12. The method of claim 11, further comprising the step of multiplexing said multiple delayed signals by an analog multiplexer controlled by said phase information signal.

13. A system for converting digital data into an analog line signal comprising:

a digital decoder for decoding said digital data to produce amplitude and phase information signals indicating amplitude and phase values of the line signal required to represent the digital data;

a digital delay line supplied with a carrier signal and having a variable delay controlled by said phase information signal to produce a phased carrier signal, said digital delay line comprising a plurality of delay cells having outputs for producing a plurality of delayed signals;

an amplifier supplied with the phased carrier signal and having a variable gain controlled by said amplitude information signal to produce said analog line signal; and an analog multiplexer having inputs coupled to the outputs of said delay cells, and controlled by said phase information signal to produce said phased carrier signal at an output of said analog multiplexer.

* * * * *